(12) United States Patent　　(10) Patent No.: US 7,898,449 B2
Kawahito et al.　　(45) Date of Patent: Mar. 1, 2011

(54) DIFFERENTIAL OPERATIONAL AMPLIFIER CIRCUIT CORRECTING SETTLING ERROR FOR USE IN PIPELINED A/D CONVERTER

(75) Inventors: Shoji Kawahito, Hamamatsu (JP); Kazutaka Honda, Hamamatsu (JP); Yasuhide Shimizu, Isahaya (JP); Kuniyuki Tani, Oogaki (JP); Akira Kurauchi, Kawasaki (JP); Koji Sushihara, Ikoma (JP); Koichiro Mashiko, Takarazuka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 12/562,664

(22) Filed: Sep. 18, 2009

(65) Prior Publication Data

US 2010/0073214 A1　Mar. 25, 2010

(30) Foreign Application Priority Data

Sep. 19, 2008　(JP) ............................. 2008-241120

(51) Int. Cl.
　　*H03M 1/12*　(2006.01)
(52) U.S. Cl. .................. 341/155; 341/158; 341/161; 341/162; 330/252; 330/253; 330/258
(58) Field of Classification Search .................. 341/155, 341/158, 161, 162; 330/252, 253, 255, 258
See application file for complete search history.

(56) References Cited

U.S. PATENT DOCUMENTS 5,442,318 A * 8/1995 Badyal et al. ................ 330/253

(Continued)

FOREIGN PATENT DOCUMENTS

JP　3597812　9/2004

(Continued)

OTHER PUBLICATIONS

Carl R. Grace et al., "A 12b 80MS/s Pipelined ADC with Bootstrapped Digital Calibration", 2004 IEEE International Solid-State Circuits Conference (ISSCC) Digest of Technical Papers, No. 25.5, pp. 460-461, Feb. 2004.

(Continued)

*Primary Examiner* — Linh V Nguyen
(74) *Attorney, Agent, or Firm* — Wenderoth, Lind & Ponack, L.L.P.

(57) ABSTRACT

A telescopic differential operational amplifier circuit for use in a pipelined A/D converter is provided with two auxiliary differential amplifiers connected to two cascode circuits, each including cascode-connected first to fourth transistors. During the sampling phase, first and second switches are turned on to apply a predetermined bias voltage to the gates of first and fourth transistors, and the input terminal of the differential operational amplifier circuit is set to a common mode voltage. During the hold phase, the first and second switches are turned off so that a voltage of each of the gates of the first and fourth transistors change to follow an input signal inputted via the input terminal with coupling capacitors operating as a level shifter of the input signal. Then the differential operational amplifier circuit performs push-pull operation operative only in a transconductance drive region, and is prevented from operating in a slewing region.

5 Claims, 16 Drawing Sheets

U.S. PATENT DOCUMENTS

| | | | |
|---|---|---|---|
| 5,748,040 A | 5/1998 | Leung | |
| 5,838,199 A * | 11/1998 | Nakamura | 330/258 |
| 5,847,607 A * | 12/1998 | Lewicki et al. | 330/258 |
| 6,259,313 B1 * | 7/2001 | Lewicki | 327/563 |
| 6,462,695 B1 * | 10/2002 | Ahuja et al. | 341/161 |
| 6,486,820 B1 * | 11/2002 | Allworth et al. | 341/161 |
| 6,756,928 B2 | 6/2004 | Kawahito et al. | |
| 6,972,706 B2 * | 12/2005 | Snoeijs | 341/158 |
| 7,113,039 B2 * | 9/2006 | Zanchi | 330/252 |
| 7,138,866 B2 * | 11/2006 | Etoh | 330/253 |
| 7,148,832 B2 * | 12/2006 | Wada et al. | 341/155 |
| 7,265,621 B1 * | 9/2007 | Min | 330/253 |
| 7,265,703 B2 * | 9/2007 | Sasaki et al. | 341/161 |
| 7,397,306 B2 * | 7/2008 | Sutardja | 330/253 |
| 2005/0162232 A1 | 7/2005 | Etoh | |

FOREIGN PATENT DOCUMENTS

| | | |
|---|---|---|
| JP | 2005-210635 | 8/2005 |
| JP | 2007-274631 | 10/2007 |

OTHER PUBLICATIONS

Boris Murmann et al., "A 12-bit 75-MS/s Pipelined ADC Using Open-Loop Residue amplification", IEEE Journal of Solid-State Circuits, vol. 38, No. 12, pp. 2040-2050, Dec. 2003.

Echere Iroaga et al., "A 12b, 75 MS/s Pipelined ADC Using Incomplete Settling", 2006 Symposium on VLSI Circuits Digest of Technical Papers, pp. 274-275, Jun. 2006.

Echere Iroaga et al., "A 12-Bit 75-MS/s Pipelined ADC Using Incomplete Settling", IEEE Journal of Solid-State Circuits, vol. 42, No. 4, Apr. 2007.

Olaf Stroeble et al., "An 80 MHz 10b Pipeline ADC with Dynamic Range Doubling and Dynamic Reference Selection", 2004 IEEE International Solid-State Circuits Conference (ISSCC) Digest of Technical Papers, No. 25.6, pp. 462-463, Feb. 2004.

* cited by examiner

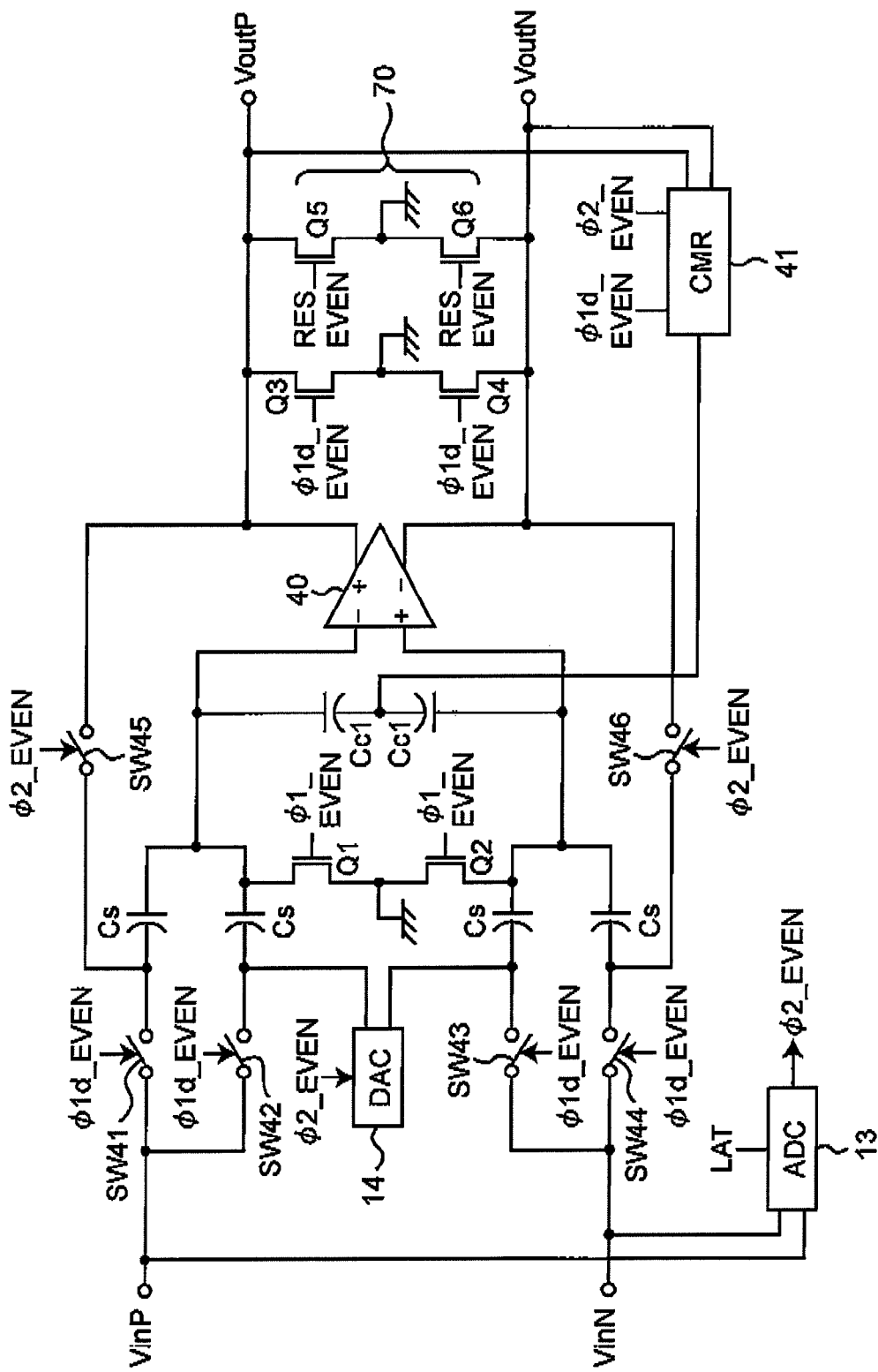
Fig. 11 A/D CONVERTER CIRCUIT PART (MDAC)10 OF EVEN-NUMBER STAGE

DIFFERENTIAL OPERATIONAL AMPLIFIER CIRCUIT CORRECTING SETTLING ERROR FOR USE IN PIPELINED A/D CONVERTER

BACKGROUND OF THE INVENTION

1. Field of the Invention

The present invention relates to a differential operational amplifier circuit that is employed for use in, for example, a pipelined A/D converter, where the differential operational amplifier corrects a settling error, and relates to a pipelined A/D converter that employs the differential operational amplifier circuit.

2. Description of the Related Art

In these days when analog-digital consolidation system LSIs play great roles with developments in communication systems and video technologies, reductions in power consumptions of analog circuits are major matters of concern. Advancements in semiconductor fine processing technologies have brought developments in performance and integration density of digital circuits and achieved efficient power reductions with lowered power supply voltages. On the other hand, measures against deteriorations in signal to noise ratio (SNR) and so on due to element variations on processes and lowered voltages are necessary although the basic performances of transistors are improved, and this makes it difficult to design analog circuits for obtaining reliable performances.

Typical applications, which need a high-speed A/D converter whose resolution is 8 bits or more and conversion frequency is 10 megahertz to several hundred megahertz, include consumer-oriented image and video equipment such as digital cameras and video cameras, medical imaging systems such as ultrasonic, X-ray and CT appliances, and the front ends of wireless communication apparatuses such as wireless LAN's and portable telephones. In such applications that require high speed and high resolution, a pipelined A/D converter has been widely used. The pipelined A/D converter is a system that obtains the required resolution by performing pipeline-like operation by connecting a sample hold circuit with fundamental operating circuits that perform M-bit (fundamentally one-bit) A/D conversion per stage (multiplication type A/D converter (MDAC: Multiplying Digital-to-Analog Converter)) in a multistage cascade arrangement (See, for example, Non-Patent Documents and Patent Documents 1 and 2).

Prior art documents related to the present invention are as follows:

Patent Document 1: Japanese patent No. JP3597812;
Patent Document 2: Specification of U.S. Pat. No. 6,756,928;
Patent Document 3: Specification of U.S. Pat. No. 5,748,040;
Patent Document 4: Japanese patent laid-open publication No. JP 2005-210635 A;
Patent Document 5: Japanese patent laid-open publication No. JP 2007-274631 A;
Non-Patent Document 1: Carl R. Grace et al., A 12b 80MS/s Pipelined ADC with Bootstrapped Digital Calibration", 2004 IEEE International Slid-State Circuits Conference (ISSCC) Digest of Technical Papers, No. 25.5, pp. 460-461, February 2004;
Non-Patent Document 2: Boris Murmann et al., "A 12-bit 75-MS/s Pipelined ADC Using Open-Loop Residue amplification", IEEE Journal of Solid-state Circuits, Vol. 38, No. 12, pp. 2040-2050, December 2003;
Non-Patent Document 3: Echere Iroaga et al., A 12b, 75 MS/s Pipelined ADC Using Incomplete Settling", 2006 Symposium on VLSI Circuits Digest of Technical Papers, pp. 274-275, June 2006;
Non-Patent Document 4: Echere Iroaga et al., "A 12-Bit 75-MS/s Pipelined ADC Using Incomplete Settling", IEEE Journal of Solid-state Circuits, Vol. 42, No. 4, April 2007; and
Non-Patent Document 5: Olaf Stroeble et al., "An 80 MHz 10b Pipeline ADC with Dynamic Range Doubling and Dynamic keference Selection", 2004 IEEE International Solid-State Circuits Conference (ISSCC) Digest of Technical Papers, No. 25.6, pp. 462-463, February 2004.

Digital correction to ease the required accuracy of the analog circuit by positively using digital techniques improved in performance by scale shrinkage is generally used in the case of capacitor mismatch that is an error factor of a pipelined A/D converter, finite-gain error of an amplifier and so on. A settling error, which is similarly an error factor, disadvantageously increases power consumption as a consequence of an increase in the bias current of an amplifier if it is generally tried to reduce the error. If the settling error itself can be digitally corrected, it can obviate the need for increasing the bias current of the ampler for reducing the settling error, allowing the power consumption to be remarkably reduced. However, since the settling error when a class-A amplifier with a constant current region is employed is non-linear, there has been a problem of the necessity of a complicated correction circuit.

Prior art settling error correction methods and the problems thereof are described in detail below.

First of all, a settling error nonlinearity correction method is disclosed in the Non-Patent Document 1. According to this method, a bit-pipelined A/D converter of a closed-loop architecture has a circuit to digitally correct the finite-gain error and nonlinearity in the slewing region. When input signal amplitude is large, the nonlinearity generated as a consequence of incomplete settling due to the influence of slewing is corrected by fitting with an even-order function. According to the this method, the incomplete settling is corrected as a second-order nonlinear function, a complicated correction circuit results with the necessity of a digital multiplier or the Me, and this therefore has led to a problem that the method is not suitable for high resolution of 14 bits or more.

Another settling error nonlinearity correction method using an open-loop architecture is disclosed in the Non-Patent Documents 2 to 4. According to this method, a 12-bit pipelined A/D converter that uses the open loop architecture achieves low power consumption by digitally correcting the nonlinearity, device mismatch and incomplete settling. Assuming that RL is the output resistance of an amplifier and CL is load capacitance, then the settling response of the open loop architecture becomes $\tau = RLCL$ when the time constant of the circuit is fallen within the operational range of the amplifier. Therefore, the settling response becomes a linear error in the first-order step response. According to this method, odd-order (third and fifth) nonlinearities ascribed to the open loop architecture itself remain and a complicated correction circuit becomes necessary, and this therefore has led to a problem that the method is not suitable for high resolution of 14 bits or more.

Furthermore, an error correction method with dynamic range doubling is disclosed in the Non-Patent Document 5. According to this method, a signal to noise ratio (SNR) is improved by doubling the input amplitude with respect to the amplitude in the A/D converter by adding other two comparators to the first stage of a conventional 1.5-bit/stage pipeline stage, and power consumption is reduced. According to this method, there has been a problem that an increase in the power consumption of the added comparators, an areal increase due to the added sampling capacitance and recovery of dynamic range in the digital region become necessary.

SUMMARY OF THE INVENTION

An object of the present invention is to solve the above problems and provide a differential operational amplifier circuit capable of being employed for use in a high-resolution A/D converter of 14 bits or more and highly accurately correcting the settling error with a simple configuration compared to the prior art and a pipelined A/D converter that employs the differential operational amplifier circuit.

In order to achieve the aforementioned objective, according to one aspect of the present invention, there is provided a telescopic differential operational amplifier circuit for use in a pipelined A/D converter that operates during a sampling phase and a hold phase, and the differential operational amplifier circuit includes two auxiliary differential amplifiers connected to two cascode circuits, where each of the cascode circuits is configured to include cascode-connected first to fourth transistors. The differential operational amplifier circuit includes an input terminal of the differential operational amplifier circuit, an output terminal of the differential operational amplifier circuit, and first and second switches. The input terminal of the differential operational amplifier circuit is connected to a gate of the first transistor and a gate of the second transistor via first and second coupling capacitors, respectively, in each of the cascode circuits. The output terminal of the differential operational amplifier circuit is connected to a connecting point of cascode-connected third and fourth transistors in each of the cascode circuits. The first switch is connected to a connecting point of a gate of the first transistor and the first coupling capacitor in each of the cascode circuits, and the second switch is connected to a connecting point of a gate of the fourth transistor and the second coupling capacitor in each of the cascode circuits. During the sampling phase, the first and second switches are turned on to apply a predetermined bias voltage to the gates of the first and fourth transistors, and the input terminal of the differential operational amplifier circuit is set to a common mode voltage. On the other hand, during the hold phase, the first and second switches are turned off so that a voltage of each of the gates of the first and fourth transistors change to follow an input signal inputted via the input terminal with the coupling capacitor operating as a level shifter of the input signal. Then the differential operational amplifier circuit performs push-pull operation that is operative only in a transconductance drive region and prevented from operating in a slewing region.

According to another aspect of the present invention, there is provided a pipelined A/D converter includes a sample hold circuit for sampling and holding an input signal, and a plurality of stages of A/D converter circuit parts for successively performing A/D conversion of signals sampled and held. Each of the A/D converter circuit parts includes a further sample hold circuit, a sub-A/D converter, a D/A converter, and a residual error amplifier. The further sample hold circuit samples and holds a signal inputted to the A/D converter circuit part, and the sub-A/D converter performs A/D conversion of a signal inputted to the A/D converter circuit part into a digital output code. The D/A converter performs A/D conversion of the digital output code, and the residual error amplifier obtains a residual error between a signal sampled and held by the further sample hold circuit and the A/D converted signal and amplifying the residual error. The residual error amplifier is configured to include the above-mentioned telescopic differential operational amplifier circuit for use in the pipelined A/D converter that operates during the sampling phase and the hold phase. The sub-A/D converter performs A/D conversion of an input voltage by a 1.5-bit/stage transfer characteristic such that the input voltage is limited in a first reference voltage range narrower than a predetermined reference voltage range, and an output voltage from the sub-A/D converter is limited in a second reference voltage range narrower than the predetermined reference voltage range.

In addition, the above-mentioned pipelined A/D converter preferably further includes a full-scale converter for full-scale converting the digital output code outputted from the sub-A/D converter, by simply summing up the digital output code and a code obtained by shifting the digital output code by two bits.

Further, the above-mentioned pipelined A/D converter preferably further includes a reset circuit for resetting the differential operational amplifier circuit so as to short-circuit the output terminal of the differential operational amplifier circuit of the residual error amplifier, for an initial period during the hold phase of each of the A/D converter circuit parts.

According to the differential operational amplifier circuit for use in the pipelined A/D converter of the present invention, linearly correcting the settling error is able not only to facilitate the provision of a correction circuit in the digital region but also to remarkably ease the required accuracy of the settling error. According to simulation results conducted by the present inventor and others, the settling time can be reduced by half, and therefore, the power consumption can be reduced to about half that of the prior art. The reason is that, if it is tried to reduce the settling error, then the bias current of the differential operational amplifier generally increases, and the power consumption disadvantageously increases. If the settling error itself can be digitally corrected, it obviates the need for increasing the bias current of the amplifier for reducing the settling error, and therefore, the required accuracy of the analog circuit is eased.

The non-slewing differential operational amplifier of the present invention, which has small static power consumption, however has a great driving ability in the case where the amplifier charges and discharges the capacitance. An output drive current being almost two or more times that of the conventional amplifier is obtained in the gm drive region, and a greater output drive current is obtained in the slewing region. In addition, the static power consumption is allowed to be about half that of a folded cascode amplifier since there are two unit bias current lines, and therefore, power efficiency is very high. The reason is that the amplifier is not of the constant current drive type but has push-pull operation (class AB operation).

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 11 is a circuit diagram showing a detailed configuration of the A/D converter circuit part (MDAC) 10 of the even-number stages of FIG. 1;

DETAILED DESCRIPTION OF THE PREFERRED EMBODIMENTS

Figure 1:
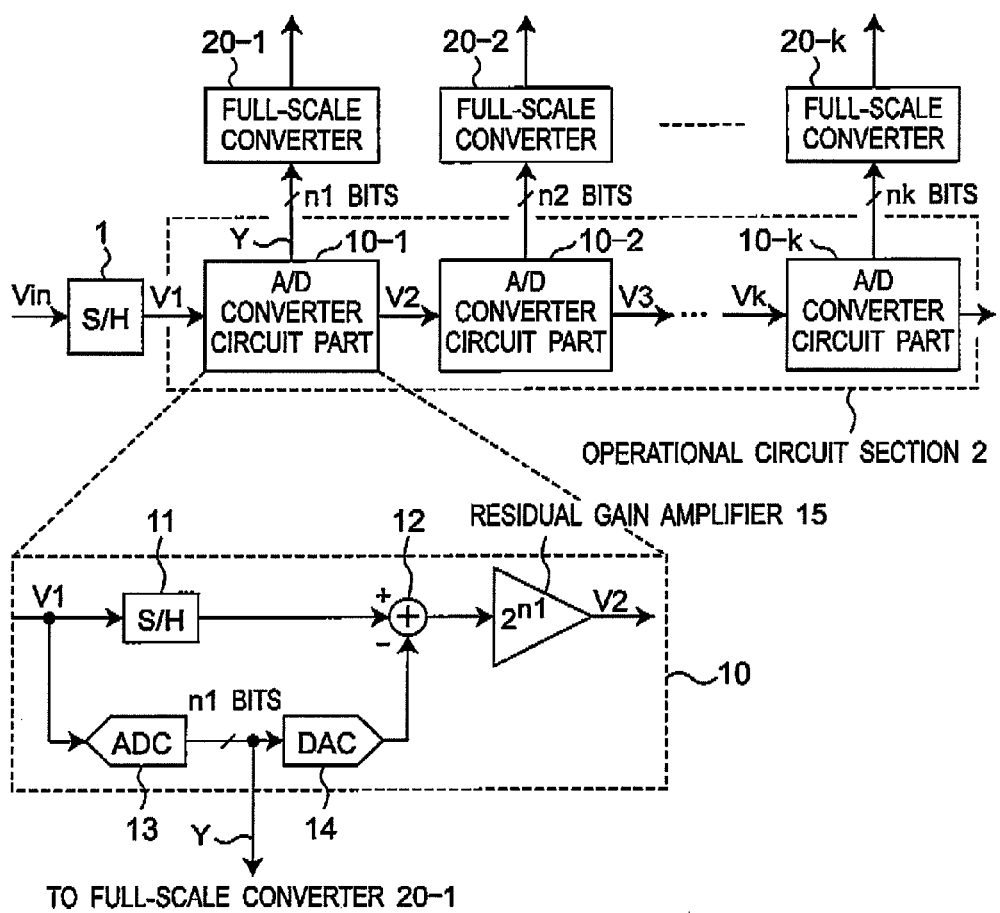
FIG. 1 is a block diagram showing a configuration of a pipelined A/D converter according to one preferred embodiment of the present invention.

Preferred embodiments according to the present invention will be described with reference to the drawings. In each of the following preferred embodiments, like components are denoted by like reference numerals.

Generally speaking, in a pipelined A/D converter that is a Nyquist A/D converter, oversampling cannot be used since the conversion rate is fast, and an error correction circuit, a large sampling capacity and so on are necessary for a high-resolution A/D converter of an effective resolution of 12 bits or more. According to the conventional technique, power consumption still further increases, and the power consumption at the product level sometimes reaches several Watts also depending on the conversion rate. In order to provide a high-resolution pipelined A/D converter with low power consumption in the preferred embodiment of the present invention, a closed loop architecture of a non-slewing high power efficiency amplifier that has no constant current drive region and a digital correction technique of the settling error linearized by preferably using, for example, the 1.5-bit/stage transfer characteristic with a limited output amplitude are proposed.

FIG. 1 is a block diagram showing a configuration of a pipelined A/D converter according to one preferred embodiment of the present invention. Referring to FIG. 1, the pipelined A/D converter of the present preferred embodiment is configured to include a sample hold circuit 1, A/D converter circuit parts 10-1 to 10-k (generically denoted by numeral 10) of a plurality of k stages, and full-scale converters 20-1 to 20-k (generically denoted by numeral 20) connected to the output terminals of the respective A/D converter circuit parts 10. Referring to FIG. 1, an analog input signal is received, sampled and held by the sample hold circuit 1. Subsequently, an input voltage is doubled by the pipeline stage of each of the A/D converter circuit parts 10, and a reference voltage is added to or subtracted from the input voltage. Each of the A/D converter circuit parts 10 is configured to include a low-resolution sub A/D converter 13 that performs A/D conversion of an output voltage of the precedent stage by means of a comparator, a sample hold circuit 11 that samples the output voltage of the precedent stage, a D/A converter 14 that performs D/A conversion of a digital output code Y from the sub-A/D converter 13, a subtractor 12 that performs operation of a residual error by subtracting the output signal from the D/A converter 14 from the output signal from the sample hold circuit 11, and a residual error gain amplifier 15 that amplifies the residual error. It is noted that a digital output code Y from the sub-A/D converter 13 is outputted to the full-scale converter 20 and full-scale converted as described later.

Figure 2:
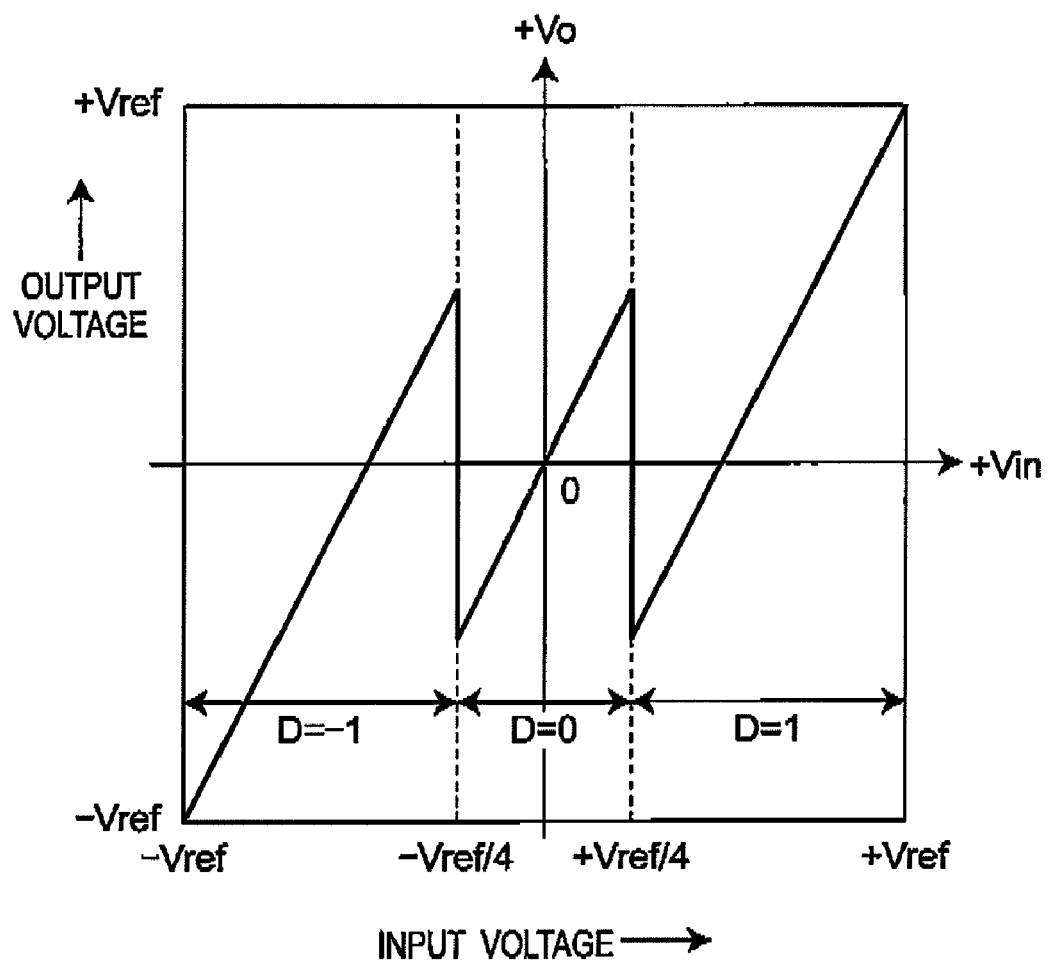
FIG. 2 is a graph showing a prior art input-output transfer characteristic of A/D converter circuit parts 10-1 to 10-$k$ in the operational circuit section 2 of FIG. 1.

FIG. 2 is a graph showing a prior art input-output transfer characteristic of A/D converter circuit parts 10-1 to 10-k in the operational circuit section 2 of FIG. 1. When the A/D converter circuit parts 10 are each configured to include 1.5 bits per stage using the redundant binary representation, A/D conversion is performed by the input-output transfer characteristic as shown in FIG. 2. The fundamental operational circuit is referred to as a multiplication type D/A converter (MDAC (Multiplying DAC), and the fundamental operation in the A/D converter circuit part 10 of each stage is expressed by the following Equation:

$$V\text{out}=2^k V\text{in}-(d_0+2^1 d_1+\ldots+2^{k-1} d_{k-1})V\text{ref} \quad (1),$$

where $d_i=\{-1, 0, 1; i=0, 1, \ldots, k-1\}$, and Vref is a reference voltage to determine the full scale of the A/D converter.

Figure 3:
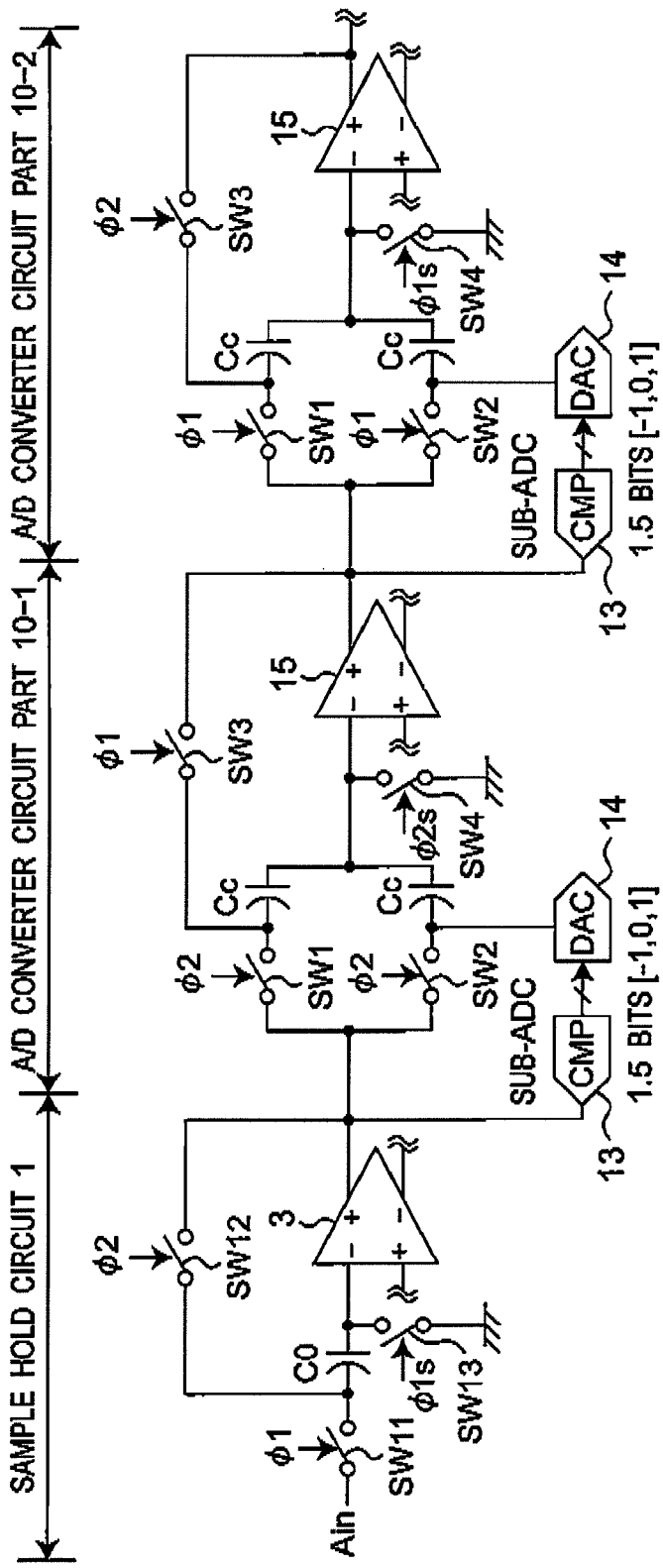
FIG. 3 is a circuit diagram of parts from a sample hold circuit 1 to the A/D converter circuit part 10-2 of FIG. 1 (only a non-inverted signal processing circuit side of the differential circuit is shown, and an inverted signal processing circuit side is not shown)
Figure 4:
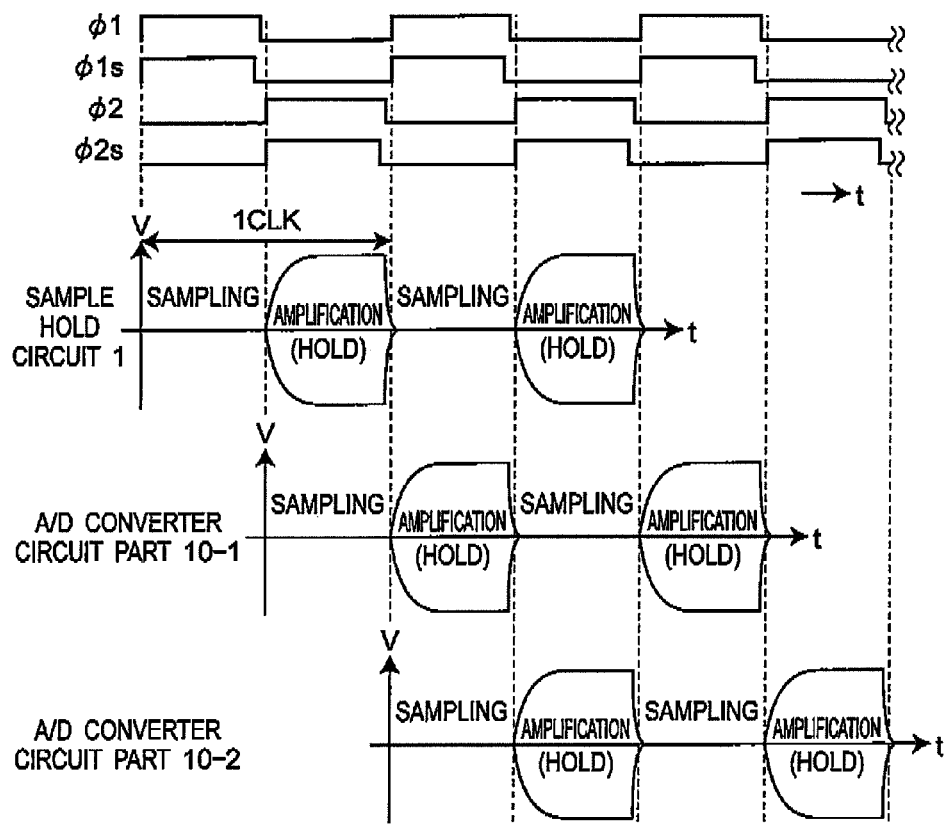
FIG. 4 is a timing chart showing an operation of the circuit of FIG. 3.

FIG. 3 is a circuit diagram of parts from the sample hold circuit 1 to the A/D converter circuit part 10-2 of FIG. 1 (only the non-inverted signal processing circuit side of the differential circuit is shown, and the inverted signal processing circuit side is not shown), and FIG. 4 is a timing chart showing an operation of the circuit of FIG. 3. Referring to FIG. 3, the sample hold circuit 1 is configured to include switches SW11 to SW13 and a differential operational amplifier 3, while each of the A/D converter circuit parts 10 is configured to include switches SW1 to SW4, two coupling capacitors Cc, a sub-A/D converter 13, a D/A converter 14, and a differential operational amplifier 15. As shown in FIG. 4, the A/D converter circuit part 10 of each stage successively repetitively executes processing in a sampling phase and processing in an amplification (hold) phase. The A/D converter circuit parts 10 of odd-number stages and the A/D converter circuit parts 10 of even-number stages operate in accordance with mutually opposite timings (timing chart signals φ1 and φ2). According to the prior art, A/D conversion is performed in a pipeline style by delivering the operational results to the subsequent stages in conformity to the input-output transfer characteristic shown in FIG. 2 every half clock from the input terminal to the final stage. The overall resolution is determined by the resolution per stage and the number of stages of the pipeline.

Figure 5:
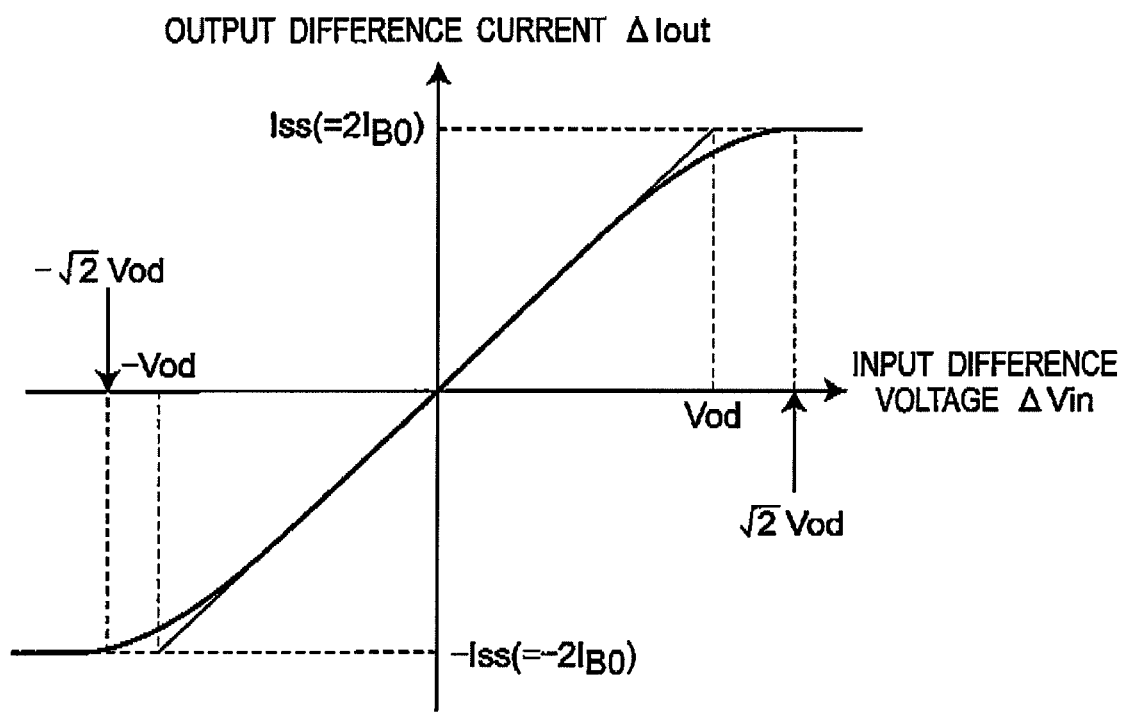
FIG. 5 is a graph showing an input-output transfer characteristic of a class-A differential operational amplifier when the differential operational amplifiers 15 of the A/D converter circuit parts 10-1 to 10-k of FIG. 3 are configured to include prior art class-A differential operational amplifiers.

FIG. 5 is a graph showing an input-output transfer characteristic of a class-A differential operational amplifier when the differential operational amplifiers 15 of the A/D converter circuit parts 10-1 to 10-k of FIG. 3 are configured to include prior art class-A differential operational amplifiers. As apparent from FIG. 5, the amplifier output operates as a constant current source (slewing region) when the difference voltage of the input of the class-A differential operational amplifier is relatively large in a transient state, and it operates as a transconductance amplifier (gm drive region) when the difference voltage is small.

Figure 6:
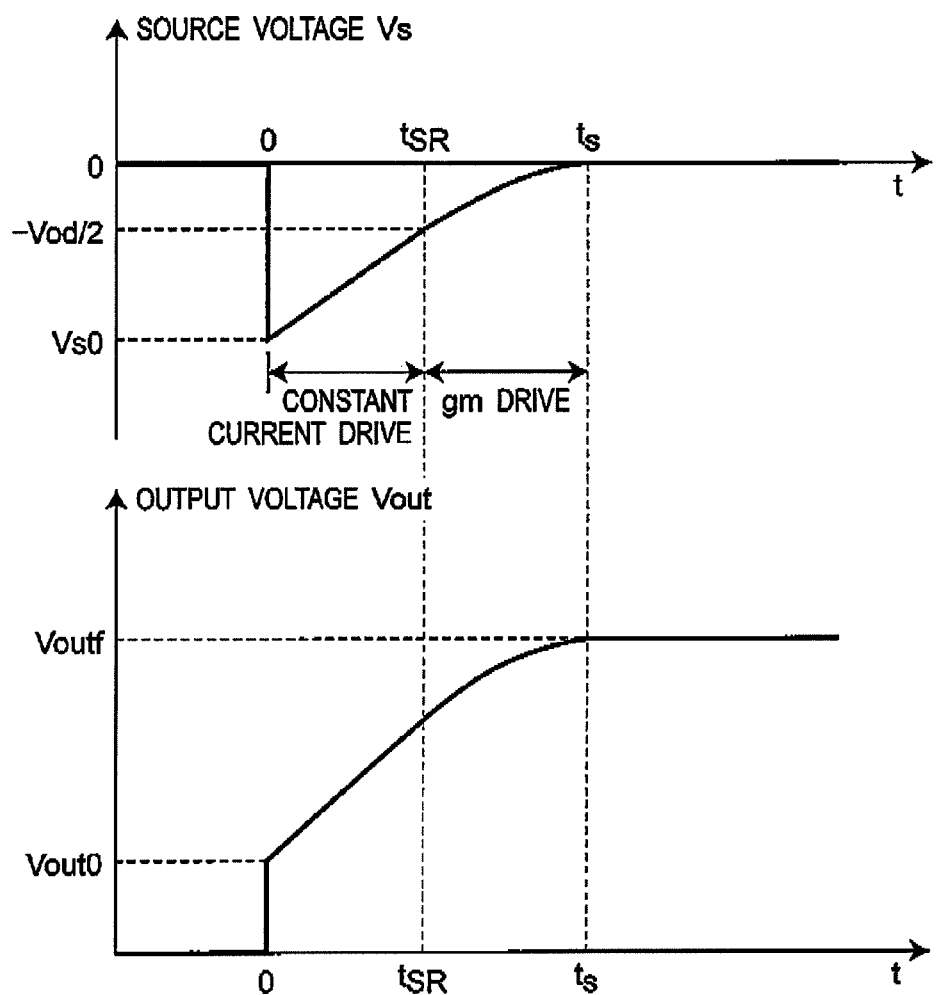
FIG. 6 is a graph showing a transient response of the class-A differential operational amplifier of FIG. 5.

FIG. 6 is a graph showing a transient response of the class-A differential operational amplifier of FIG. 5. Since the class-A differential operational amplifier operates as described above, the drive characteristic of the amplifier changes from the constant current drive to the gm drive at a timing $t_{SR}$ as to a transient response to a large input signal.

Figure 7:
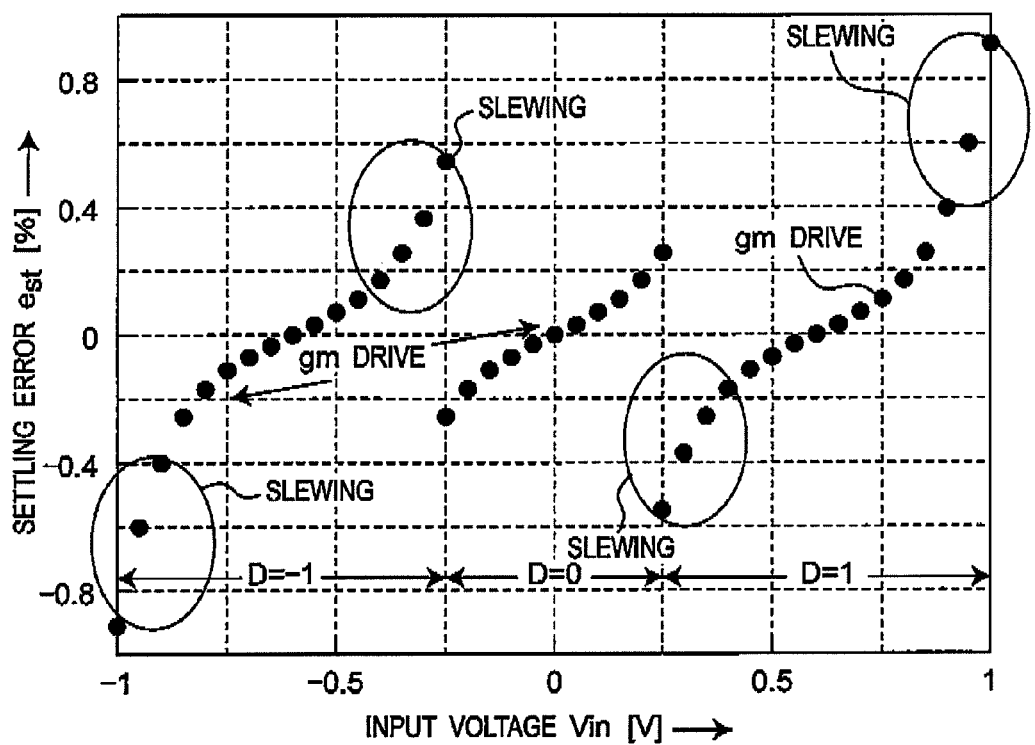
FIG. 7 is a graph of simulation results conducted by the inventor and others, showing a settling error characteristic of the prior art class-A differential operational amplifier.

FIG. 7 is a graph of simulation results conducted by the inventor and others, showing a settling error characteristic of the prior art class-A differential operational amplifier. The horizontal axis of FIG. 7 represents the input voltage Vin, and the vertical axis represents the settling error $e_{st}$ at each input voltage. The error characteristic is nonlinear because of the error characteristic configured to include a complex region of constant current drive (slewing) and gin drive, and in addition, a large error is generated in a range that input voltage |Vin|>3Vref/4. In order to correct the nonlinear settling error characteristic depending on the difference in the current drive characteristic of the class-A differential operational amplifier as described above, a complicated correction circuit configuration is disadvantageously necessary. A major cause of the nonlinear settling error is the slewing of the class-A differential operational amplifier.

Figure 8:
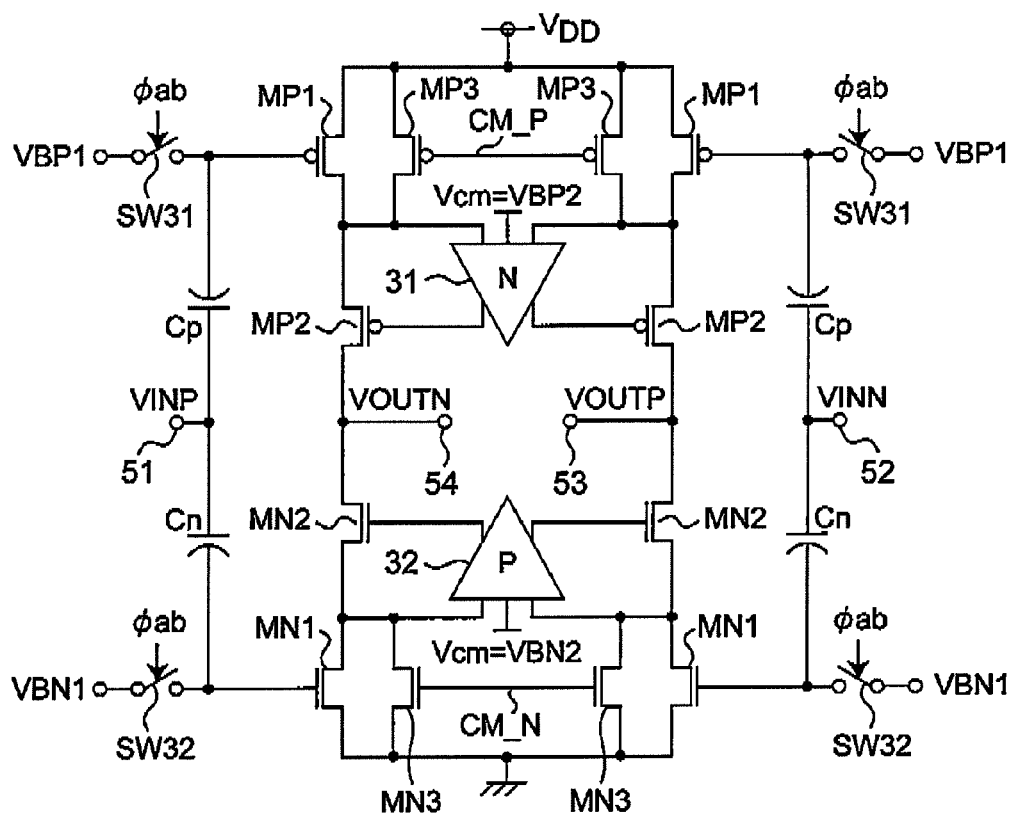
FIG. 8 is a circuit diagram showing a configuration of a capacitively coupled gain-enhanced cascode type non-stewing differential operational amplifier 40 according to a preferred embodiment of the present invention as a concrete example of differential operational amplifiers 15 of the A/D converter circuit parts 10-1 to 10-k of FIG. 3.
Figure 19:
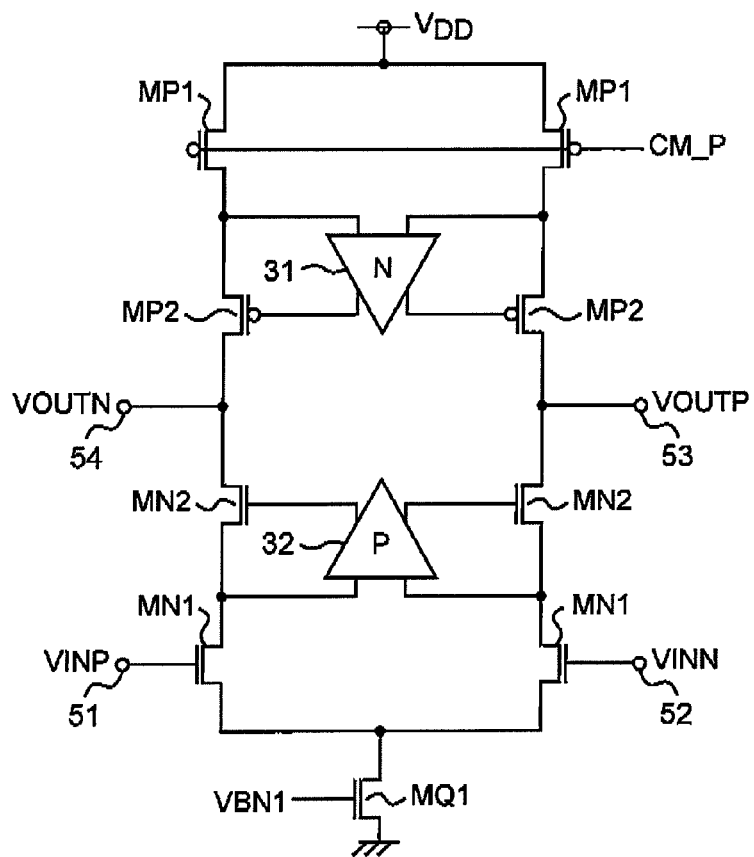
FIG. 19 is a block diagram showing a configuration of a prior art telescopic cascode differential operational amplifier 40A.

FIG. 8 is a circuit diagram showing a configuration of a capacitively coupled gain-enhanced cascode type non-slewing differential operational amplifier 40 according to a preferred embodiment of the present invention as a concrete example of the differential operational amplifiers 15 of the A/D converter circuit parts 10-1 to 10-k of FIG. 3. FIG. 19 is a block diagram showing a configuration of a prior art telescopic cascade differential operational amplifier 40A (See, for example, the Non-Patent Documents 3 to 5). In FIGS. 8 and 19, like components of the symmetric circuits are denoted by like reference numerals.

In the prior art telescopic cascode differential operational amplifier 40A of FIG. 19, gain enhancement is achieved by connecting two auxiliary differential amplifiers 31 and 32 to two cascade circuits that are each configured to include cascode-connected P-channel MOS transistors MP1 and MP2, N-channel MOS transistors MN1 and MN2, and an N-channel MOS transistor MQ1 for bias application between a power voltage VDD and the ground. Input terminals 51 and 52 are connected to the gates of one pair of N-channel MOS transistors MN1 and MN1, while output terminals 53 and 54 are connected to the respective connecting points of the P-channel MOS transistor MP2 and the N-channel MOS transistor MN2. It is noted that a common mode bias voltage $CM_{13}P$ is applied to the gates of one pair of MOS transistors MP1 and MP1, and a bias voltage VBN1 is applied to the gate of the N-channel MOS transistor MQ1.

In contrast to the above, the capacitively coupled gain-enhanced cascade type non-slewing differential operational amplifier 40 of FIG. 8 of the preferred embodiment differs from the prior art of FIG. 19 in the following points:

(1) The gates of the cascade-connected MOS transistors MN1 and MP1 are capacitively coupled to the input terminals 51 and 52 of the amplifier via coupling capacitors Cn and Cp, respectively.

(2) A bias voltage VBP1 is applied to the gates of one pair of P-channel MOS transistors MP1 and MP1 via a switch SW31, and a bias voltage VBN1 is applied to the gates of one pair of N-channel MOS transistors MN1 and MN1 via a switch SW32. With this arrangement, the gates of one pair of P-channel MOS transistor MP3 and MP3 connected in parallel with the one pair of P-channel MOS transistors MP1 and MP1 are connected together to set a common mode voltage CM_P, and one pair of N-channel MOS transistor MN3 and MN3 connected in parallel with the one pair of N-channel MOS transistor MN1 and MN1 are connected together to set a common mode voltage CM_N.

In the differential operational amplifier 40 configured as above, the four switches SW31, SW31, SW32, and SW32 are turned on in response to an H-level timing signal φab during the sampling phase, so that the gates of the MOS transistors MN1 and MP1 are biased to a predetermined proper reference voltage, and the input terminals 51 and 52 of the differential operational amplifier 40 are set to the common mode voltage at the same time. The four switches SW31, SW31, SW32 and SW32 are turned off in response to a L-level timing signal φab during the hold phase, and the MOS transistors MN1 and MP1 are disconnected from the reference voltage and made to follow the input signal. In this case, the coupling capacitors Cn and Cp operate as a level shifter of the input signal, and the differential operational amplifier 40 performs push-pull operation, meaning that the amplifier operates only in the gm drive region, and no slewing region exists.

Figure 9:
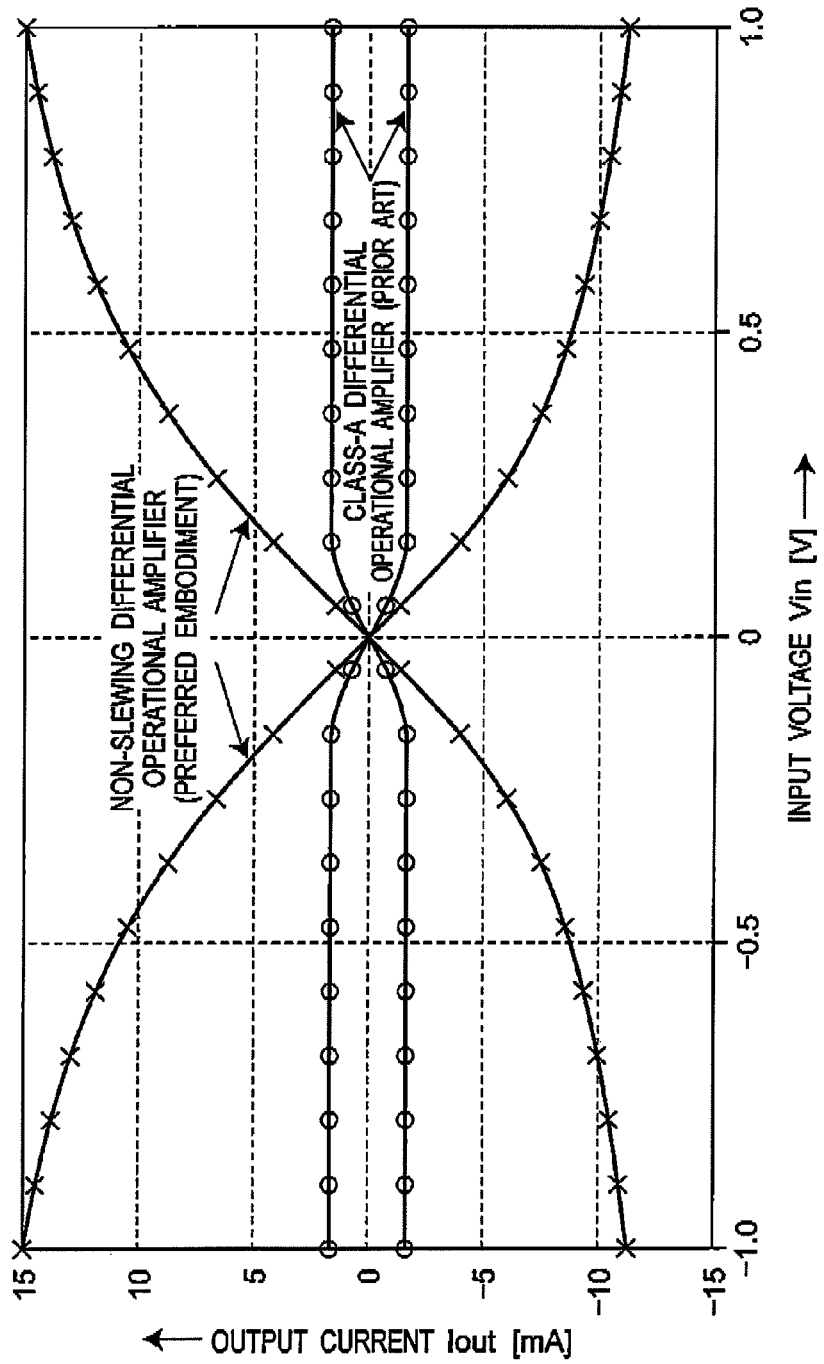
FIG. 9 is a graph of simulation results conducted by the inventor and others, showing an output current Iout to an input voltage Vin of the prior art class-A differential operational amplifier and the capacitively-coupled gain-enhanced cascade type non-stewing differential operational amplifier 40 of FIG. 8 of the present preferred embodiment.

FIG. 9 is a graph of simulation results conducted by the inventor and others, showing an output current Iout to the input voltage Vin of the prior art class-A differential operational amplifier and the capacitively-coupled gain-enhanced cascode type non-slewing differential operational amplifier 40 of FIG. 8 of the present preferred embodiment. As apparent from FIG. 9, in contrast to the fact that the maximum output drive current of the prior art class-A differential operational amplifier is limited by a unit bias current, the non-slewing differential operational amplifier 40 of the present preferred embodiment can obtain a large gm drive current since it has no tail current source. Regarding the output drive current of the non-slewing differential operational amplifier 40, an almost double output drive current can be obtained in the gm drive region of the prior art class-A differential operational amplifier, and an output drive current greater than it can be obtained in the slewing region. In addition, the static power is allowed to be half that of a folded cascode amplifier since there are two unit bias current lines, and therefore, power efficiency is very high. Although the capacitively-coupled cascode type non-slewing amplifier of the present preferred embodiment linearizes the settling error because it is free of slewing, nonlinearity is caused as a consequence of a reduction of gm with respect to a large input signal such that |Vin|>3Vref/4 according to the prior art 1.5-bit/stage transfer characteristic as apparent from FIG. 9.

Figure 10:
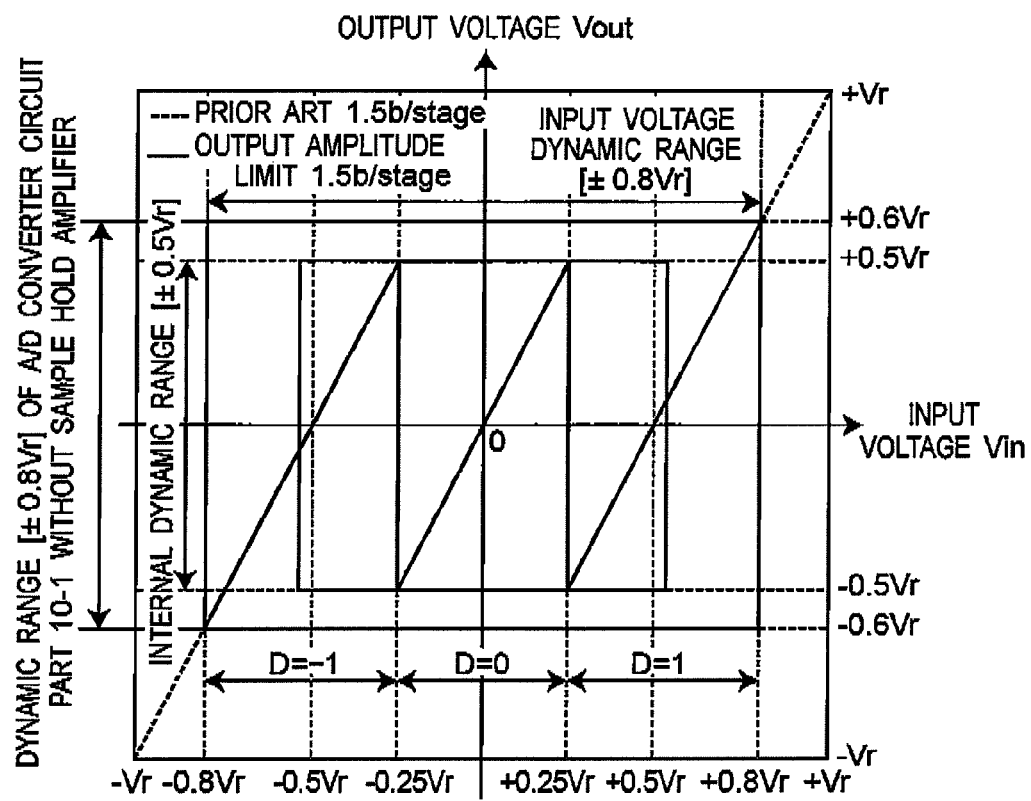
FIG. 10 is a graph showing a 1.5-bit/stage transfer characteristic of the prior art without any limitation of the output amplitude and the preferred embodiment with a limitation of the output amplitude in the A/D converter circuit part 10-1 of FIG. 3.

FIG. 10 is a graph showing a 1.5-bit/stage transfer characteristic of the prior art without any limitation of the output amplitude and the preferred embodiment with a limitation of the output amplitude in the A/D converter circuit part 10-1 of FIG. 3. In contrast to the fact that the analog signal has external input full amplitude of ±0.8 Vr (3.2 Vp-p), A/D conversion is performed with signal amplitude of ±0.5 Vr except for the first stage in the circuit (±0.6 Vr in the A/D converter circuit past 10-1 of the first stage that has no sample hold amplifier). With this transfer characteristic, high SNR can be secured since a large input signal is used, and a core device whose transistor performance is high can be employed since the internal amplitude becomes comparatively small. In addition, it fundamentally has a feature that neither additional sampling capacitance nor comparator is needed since the judgment criteria of the comparator of the sub-A/D converter 13 is merely shifted in a manner similar to that of FIG. 10 and the response characteristic comparatively resembles in three judgment regions (regions of D=−1, 0 and 1) of the 1.5-bit/stage input-output characteristic, and this makes error correction easy. Moreover, a digital output code Y when A/D conversion is performed without modification has an output amplitude limited to 80% of the full scale, and the digital output code Y corresponding to the analog input voltage range (−0.8 Vr≦Vin≦+0.8 Vr) is expressed by the following equation of 1.5-bit representation of −1, 0 and 1:

$$(-1 -1\, 0\, 0\, \ldots) \leq Y \leq (1\, 1\, 0\, 0\, \ldots) \quad (2).$$

In order to express the full-scale code of the following Equation:

$$Z(-1 -1 -1 -1 \ldots \leq Y \leq 1\, 1\, 1\, 1\, \ldots) \quad (3),$$

with respect to the analog full amplitude (±0.8 Vr) in the digital region, it is proper to multiply the digital code Y by 1/0.8 (=1.25) times. More in detail, according to the following Equation:

$$(1+2^{-2}+2^{-4})Y = 0.7619 Y \quad (4),$$

the multiplication is 1/0.7619 times. Moreover, according to the following Equation:

$$1.25 = 1 + 2^{-2} \quad (5),$$

a full-scale code Z is expressed by the following Equation:

$$Z = (1/0.8)Y = (1+2^{-2})Y \quad (6).$$

Figure 18:
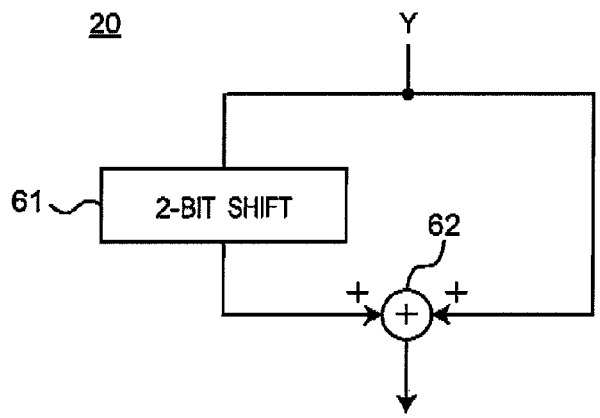
FIG. 18 is a block diagram showing one example of the configuration of the full-scale converter 20 of FIG. 1.

That is, as shown in the structural example of the full-scale converter 20 of FIG. 18, full-scale conversion can be achieved by a summation of the digital output code Y and the 2-bit shift of Y. This code conversion does not influence the dynamic performance of the A/D converter if there is an extension code of several bits with respect to 15 bits.

Figure 12A:
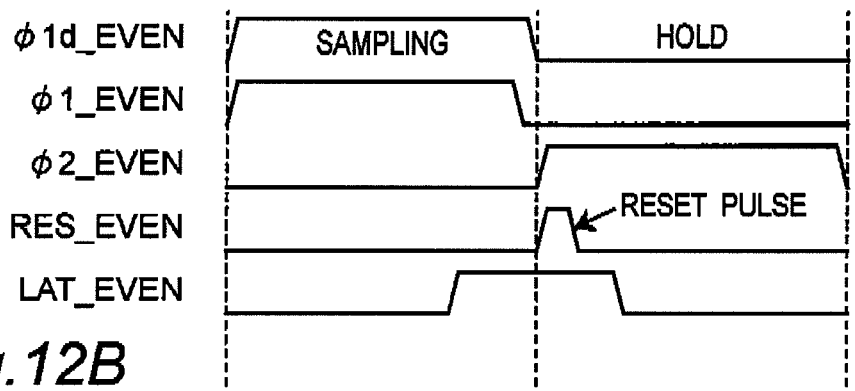
FIG. 12A is a timing chart showing an operation of the A/D converter circuit part (MDAC) 10 of odd-number stages of FIG. 1.
Figure 12B:
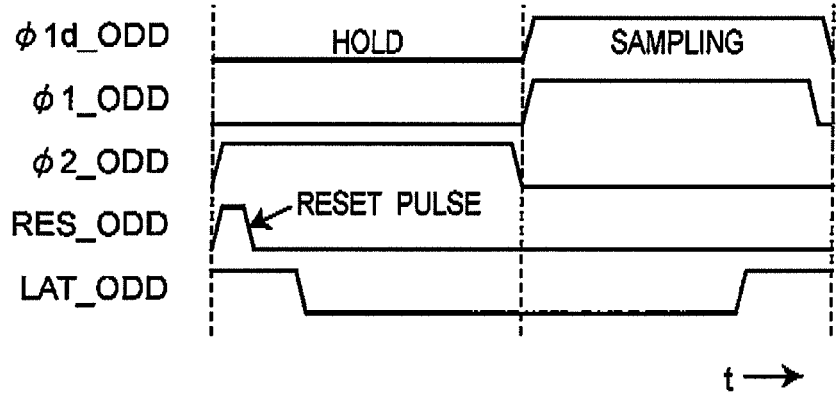
FIG. 12B is a timing chart showing an operation of the A/D converter circuit part (MDAC) 10 of even-number stages of FIGS. 1 and 11.

FIG. 11 is a circuit diagram showing a detailed configuration of the A/D converter circuit part (MDAC) 10 of the even-number stages of FIG. 1. The A/D converter circuit part 10 of the odd-number stages is similarly configured and operates at diametrically opposite timings as described later. FIG. 12A is a timing chart showing an operation of the A/D converter circuit part (MDAC) 10 of the odd-number stages of FIG. 1, and FIG. 12B is a timing chart showing an operation of the A/D converter circuit part (MDAC) 10 of the even-number stages of FIGS. 1 and 11. In FIG. 11 are shown sampling capacitors Cs, switches SW41 to SW46 and switching transistors Q1 to Q6. Moreover, a common mode regulator 41 is connected from the output terminal of the A/D converter circuit part 10 to the input terminal of the differential operational amplifier 40 via coupling capacitors Cc1 and described in detail later. The A/D converter circuit part 10 of the odd-number stages and the A/D converter circuit part 10 of the even-number stages operate at diametrically opposite timings. In a predetermined initial period during the hold phase of a timing signal φ2_EVEN, a differential output signal of the differential operational amplifier 40 is short-circuited for a short time by a reset circuit 70 configured to include switching transistors Q5 and Q6 that operate in response to a timing signal RESEVEN. Despite that a slight hold time is sacrificed, there is an effect of linearizing the error correction by resetting the initial voltage fluctuation due to the history of the sampling capacitance of the next stage to zero.

Figure 13:
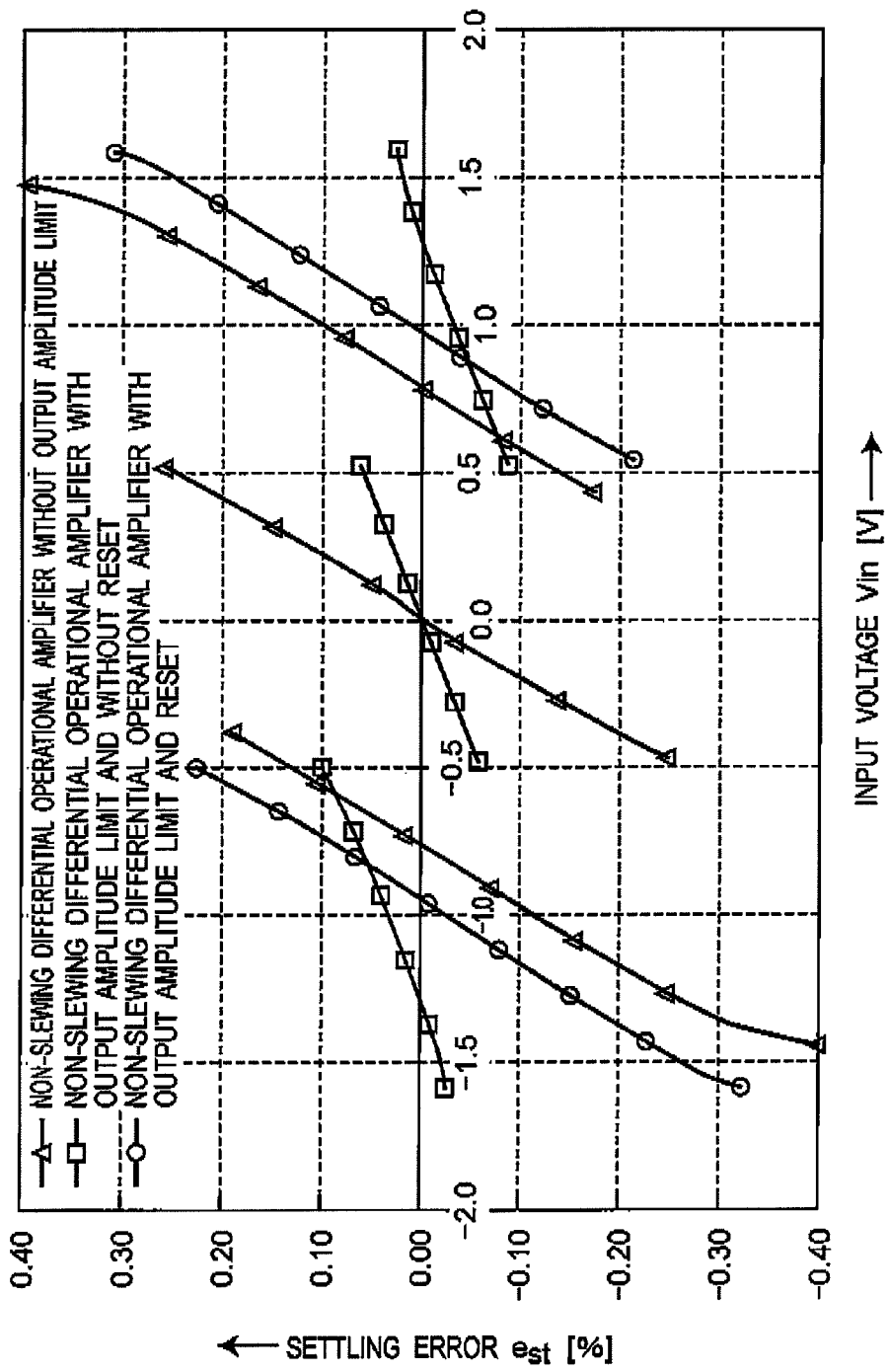
FIG. 13 is a graph showing a settling error eat with respect to the input voltage Vin of the non-slewing differential operational amplifier according to the present preferred embodiment and a comparative example.

FIG. 13 is a graph showing a settling error $e_{st}$ with respect to the input voltage Vin of the non-slewing differential operational amplifier 40 according to the present preferred embodiment and a comparative example. That is, FIG. 13 shows the settling error characteristics of the 1.5-bit/stage A/D converter circuit part (MDAC) 10 that employs the non-slewing differential operational amplifier 40 according to simulation results when MOS devices are entirely used. In FIG. 13 are shown settling error characteristics of the non-slewing differential operational amplifier 40 in;

(a) a case where the 1.5-bit/stage transfer characteristic with limited output amplitude is not used;

(b) a case where the output amplitude is limited and reset is not used; and (c) a case including all elemental technologies for linearization (i.e., a case where the output amplitude is limited and reset is used).

First of all, when the 1.5-bit/stage transfer characteristic with limited output amplitude is not used, since the output amplitude exceeds the linear range of the amplifier in the vicinity of the input at the full amplitude and transconductance gm deteriorates, a large odd-order nonlinearity characteristic is generated. When reset is not used, since the hold time is prolonged, an offset is generated in the error characteristic although the settling error is reduced. Therefore, an additional circuit for correcting the nonlinearity at discontinuous points is necessary. In comparison with these cases, it can be understood that the linearity of the settling error characteristic including all the elemental technologies is remarkably improved. Therefore, linear correction of the error becomes possible for the nonlinear settling error characteristic of the class-A differential operational amplifier of FIG. 7. A settling response using the non-slewing differential operational amplifier 40 is a response only in the gm drive region, and it behaves like a step response in a simple RC circuit if there is scarce change in the gm value in the operation region. Assuming that the settling error tolerance $e_{st}$ is one LSB, then the error is expressed by the Equation:

$$e_{st} = 1/2^{15} = 0.003\% \quad (7)$$

in terms of 15-bit resolution, and a settling time of 10.5 is necessary. Assuming that a maximum settling error when the non-slewing differential operational amplifier 40 is used is about 0.3% and the error can be linearly corrected, then the settling time is eased to 5.8τ (τ is a time constant in this case), and a settling time can be reduced by about 45%. This produces an effect equivalent to doubling the efficiency without increasing the bias current of the differential operational amplifier, and therefore, a power reduction effect of about 45% is achieved as a result.

Moreover, in the A/D converter circuit part (MDAC) 10 of FIG. 11, the common mode regulator (CMR) for controlling the common mode of the capacitively coupled cascade type non-stewing differential operational amplifier 40 is employed. The non-slewing differential operational amplifier 40, which has no tail current generator, is inherently susceptible to power fluctuations and common fluctuations, The amplifier is particularly sensitive to the common mode of the amplifier input, and the amplifier input stage has no tail current source and operates pseudo-differentially. Therefore, offsets of the input common components accumulate more significantly in the subsequent stages of the pipeline stages, and the signal amplitude disadvantageously becomes saturated within the dynamic range, consequently failing in performing A/D conversion any more. Although a current being 20% of a unit bias current Io is flowed for common mode compensation in the output stage of the amplifier, it is insufficient when the common of the input largely varies.

Figure 14:
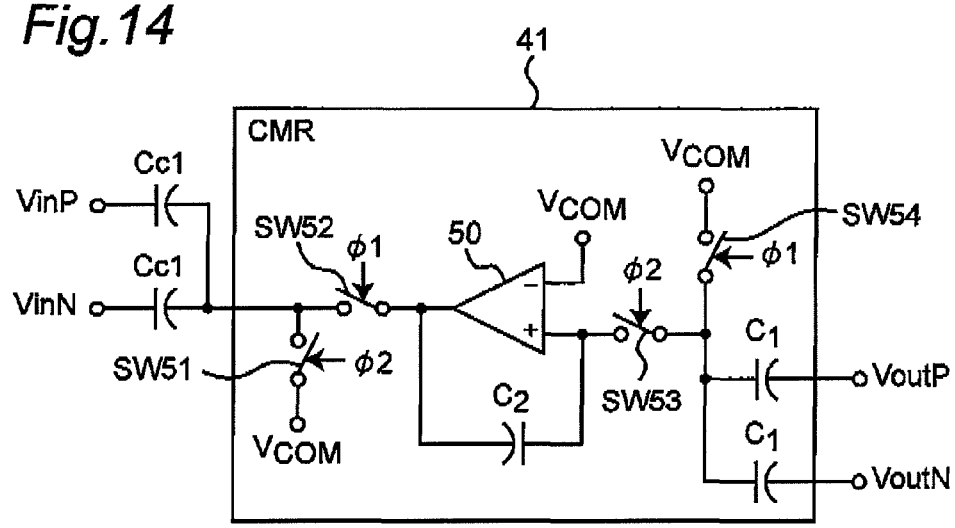
FIG. 14 is a circuit diagram showing a detailed configuration of the common mode regulator 41 of FIG. 11.

FIG. 14 is a circuit diagram showing a detailed configuration of the common mode regulator 41 of FIG. 11. Referring to FIG. 14, the common mode regulator 41 is configured to include four switches SW51 to SW54, a differential operational amplifier 50 that constitutes an integrator with a feedback capacitor C2, and input capacitors C1. That is, the common mode regulator 41 detects a difference between the differential output voltage (VoutP, VoutM) of the A/D converter circuit part (MDAC) 10 and the common component of the common mode voltage VCOM by input capacitors C1, integrates the difference by the switched capacitor integrator of the differential operational amplifier 50 and transmits the output signal of the integrator to the input terminals of the differential operational amplifier 40 via coupling capacitors Cc1.

Figure 15:
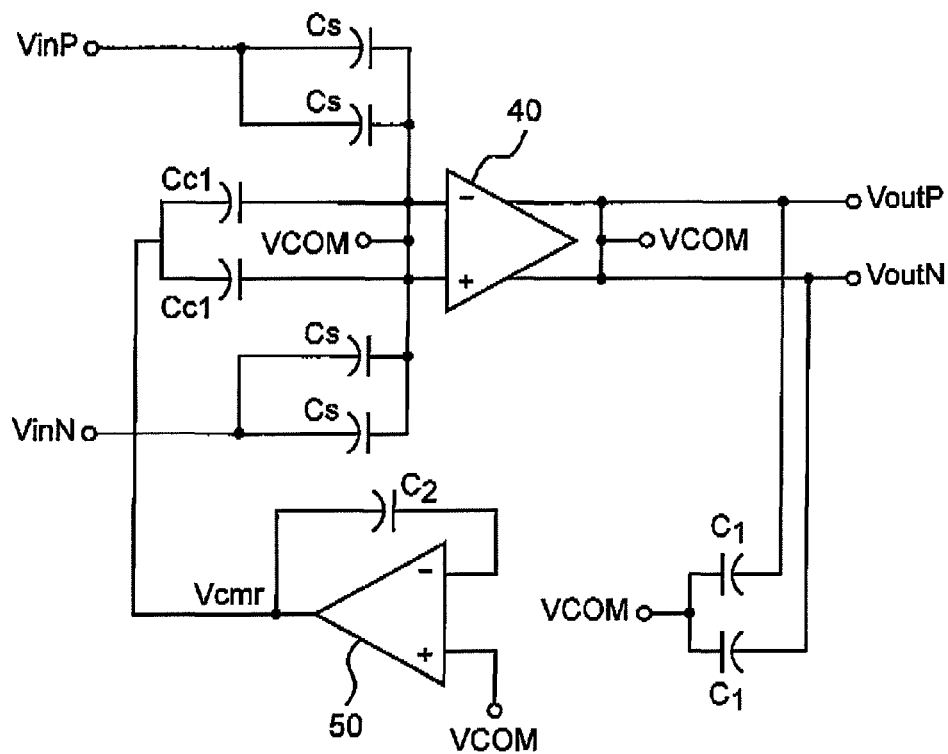
FIG. 15 is a circuit diagram showing an operation during the sampling phase of FIG. 11.
Figure 16:
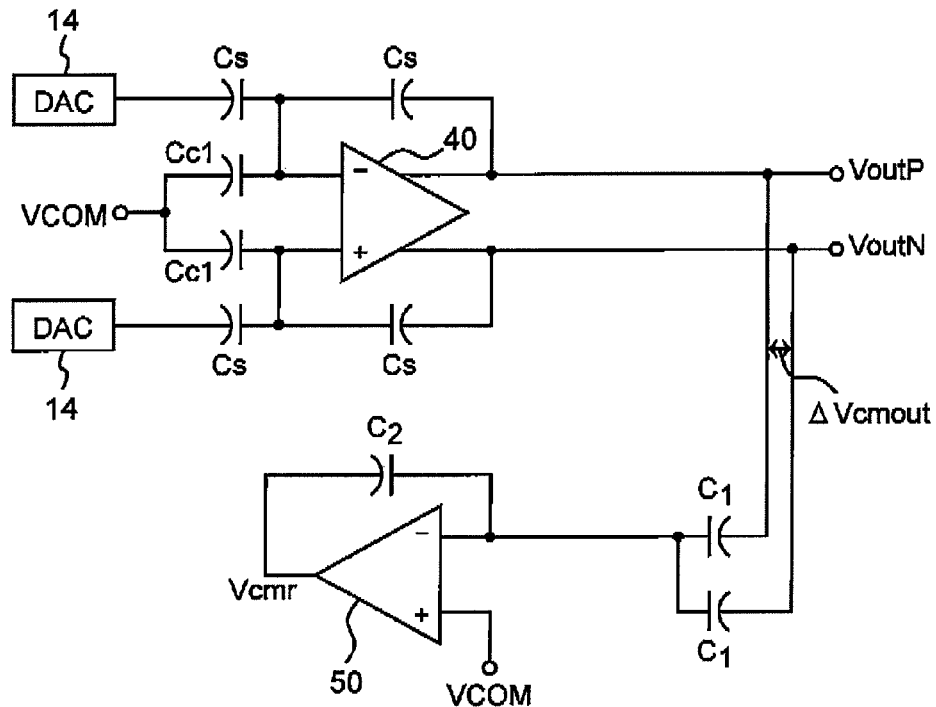
FIG. 16 is a circuit diagram showing an operation during the hold phase of FIG. 11.
Figure 17:
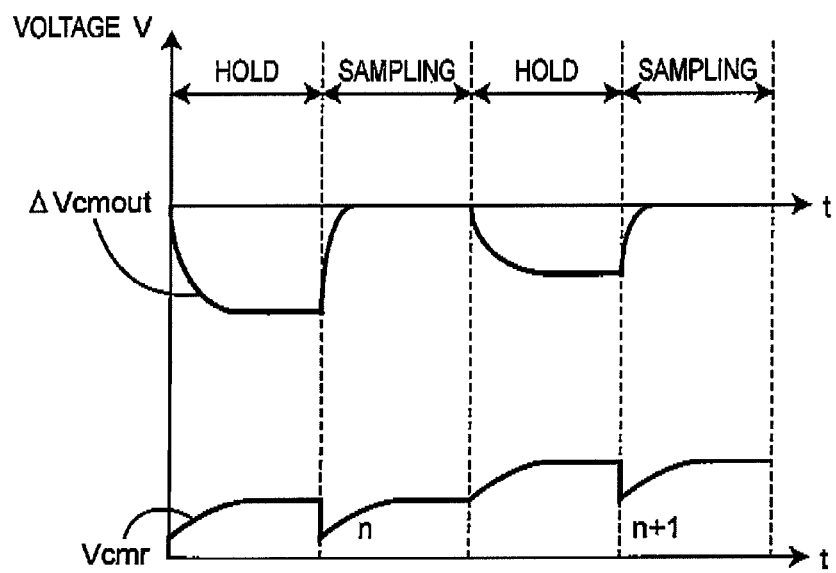
FIG. 17 is a graph showing a time response waveforms of a common mode difference voltage $\Delta$Vcmount outputted from the differential operational amplifier 40 and a common mode integral output voltage Vcmr outputted from the differential operational amplifier 50 for integration in the circuits of FIGS. 15 and 16.

FIG. 15 is a circuit diagram showing an operation during the sampling phase of FIG. 11, and FIG. 16 is a circuit diagram showing an operation during the hold phase of FIG. 11. FIG. 17 is a graph showing a time response waveforms of a common mode difference voltage ΔVcmount outputted from the differential operational amplifier 40 and a common mode integral output voltage Vcmr outputted from the differential operational amplifier 50 for integration in the circuits of FIGS. 15 and 16.

During the hold phase of FIG. 16, the common mode difference voltage ΔVcmout is monitored by the input coupling capacitors C1, and a difference between the input voltage and the common mode voltage VCOM is accumulated in the integrator. During the sampling phase of FIG. 15, the common mode integral output voltage Vcmr is accumulated in the capacitors Cc1, and the capacitors Cc1 are reset by the common mode voltage VCOM at the same time. At the next hold phase, by injecting the electric charges accumulated in the capacitors Cc1 into the amplifier input, the common mode of the amplifier output is controlled. A loop configured to include the A/D converter circuit part (MDAC) 10 and the common mode regulator 41 operates as a discrete time negative feedback system so that the output fluctuation becomes zeroed by a long-term integration (about one microsecond). Assuming that the feedback capacitance of the integrator is C2, then a transfer function H(z) of the common mode difference voltage ΔVcmout with respect to the common mode integral output voltage Vcmr is expressed by the following Equation:

$$H(z) = -\frac{2C_1}{C_2} \frac{1}{1 - Z^{-1}}. \tag{8}$$

Since the voltage fluctuation of the common mode is like a direct current, assuming that $\omega T \ll \pi$ and $C1=C2$, then a transfer function $H(j\omega T)$ is expressed by the following Equation:

$$H(j\omega T) = \frac{C_1}{C_2} \frac{1}{\sin(\omega T/2)} \cong \frac{1}{\omega T}. \tag{9}$$

Summary of Preferred Embodiments

The features of the configuration of the present preferred embodiment are as follows.

(1) As shown in FIG. 8, there is provided the non-slewing amplifier 40 of a simple structure in which the gates of the MOS transistors MN1 and MP1 of the cascode stage are capacitively coupled to the input terminals 51 and 52 of the amplifier via the coupling capacitors Cp and Cn. During the sampling phase, the switches SW31 and SW32 are turned on in response to the H-level timing signal φab, the gates of the MOS transistors MN1 and MP1 are biased to a predetermined proper reference voltage, and the input terminals 51 and 52 of the amplifier are set to the common mode voltage at the same time. During the hold phase, the switches SW31 and SW32 are turned off in response to the L-level timing signal φab, and the MOS transistors MN1 and MP1 are disconnected from the reference voltage and made to follow the input signal. In this case, the coupling capacitors Cp and Cn operate as a level shifter of the input signal, and the amplifier 40 performs push-pull operation, meaning that the amplifier operates only in the gm drive region, and no constant current drive (stewing) region exists.

(2) By virtue of the 1.5-bit/stage transfer characteristic (FIG. 10) such that the amplitude of A/D conversion is performed with a small signal amplitude of ±0.5 Vr (output amplitude is limited) in the circuit while an external large input amplitude of ±0.8 Vr (3.2 Vpp) is handled, a high SNR is secured, and a core device having high transistor performance can be used. This configuration, in which the judgment criteria of the comparator of the sub A/D converter 13 is fundamentally merely shifted, needs neither additional sampling capacitance nor comparator and has a feature that the response characteristic comparatively resembles in three judgment regions (regions of D=−1, 0, 1) of the 1.5-bit/stage input-output characteristic, making easy error linear correction.

(3) The digital output code Y is limited to 80% of the full scale by the 1.5-bit/stage transfer characteristic such that the output amplitude is limited, and, as shown in FIG. 18, digital full-scale conversion can be achieved by a simple summation of Y and the 2-bit shift of Y.

(4) As shown in FIG. 12, the differential output voltage from the differential operational amplifier 40 is short-circuited for a short time by reset operation performed initially during the hold phase of the pipeline stages. Despite that a slight hold time is sacrificed, there is an effect of linearizing the error correction by resetting the initial voltage fluctuation due to the history of the sampling capacitance of the next stage to zero.

(5) As shown in FIG. 14, the common mode regulator (CMR) 41 is employed to control the common mode of the non-dewing differential operational amplifier 40 susceptible to power fluctuations and fluctuations in the common mode voltage.

Therefore, according to the present preferred embodiment, there are peculiar operational effects as follows.

(I) By linearly correcting the settling error, not only the correction circuit in the digital region is made easy but also the accuracy of the required settling error can be largely eased. According to the simulation results conducted by the present inventor and others, the settling time can be reduced by half, and therefore, power consumption can be reduced to about half that of the prior art. The reason is that, if it is tried to reduce the settling error, then the bias current of the differential operational amplifier generally increases, and the power consumption disadvantageously increases. If the settling error itself can be digitally corrected, it obviates the need for increasing the bias current of the amplifier for reducing the settling error, and therefore, the required accuracy of the analog circuit is eased.

(II) The non-slewing amplifier, which has small static power consumption, has a great driving ability in the case where the amplifier charges and discharges the capacitance. An output drive current being almost two or more times that of the conventional amplifier is obtained in the gm drive region, and a greater output drive current is obtained in the slewing region. In addition, the static power consumption is allowed to be about half that of a folded cascode amplifier since there are two unit bias current lines, and therefore, power efficiency is very high. The reason is that the amplifier is not of the constant current drive type but has push-pull operation (class AB operation).

Modified Preferred Embodiment

The auxiliary differential operational amplifiers 31 and 32, which are inserted for gain enhancement in the above preferred embodiment, may be removed when there is no need to enhance the gain.

INDUSTRIAL APPLICABILITY

As described in detail above, according to the differential operational amplifier circuit for the pipelined A/D converter of the present invention, not only the correction circuit in the digital region is made easy but also the required accuracy of the settling error can be largely eased by linearly correcting the settling error. According to the simulation results conducted by the present inventor and others, the settling time can be reduced by half, and therefore, power consumption can be reduced to about half that of the prior art. The reason is that, if it is tried to reduce the settling error, then the bias current of the differential operational amplifier generally increases, and the power consumption disadvantageously increases. If the settling error itself can be digitally corrected, it obviates the need for increasing the bias current of the amplifier for reducing the settling error, and therefore, the required accuracy of the analog circuit is eased.

The non-slewing differential operational amplifier of the present invention, which has small static power consumption, however has a great driving ability in the case where the amplifier charges and discharges the capacitance. An output drive current being almost two or more times that of the conventional amplifier is obtained in the gm drive region, and a greater output drive current is obtained in the slewing region. In addition, the static power consumption is allowed to be about half that of a folded cascode amplifier since there are two unit bias current lines, and therefore, power efficiency is very high. The reason is that the amplifier is not of the constant current drive type but has push-pull operation (class AB operation).

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A telescopic differential operational amplifier circuit for use in a pipelined A/D converter that operates during a sampling phase and a hold phase, the differential operational amplifier circuit including two auxiliary differential amplifiers connected to two cascode circuits, each cascode circuit being configured to include cascode-connected first to fourth transistors, the differential operational amplifier circuit comprising:

an input terminal of the differential operational amplifier circuit, the input terminal being connected to a gate of the first transistor and a gate of the second transistor via first and second coupling capacitors, respectively, in each of the cascode circuits;

an output terminal of the differential operational amplifier circuit, the output terminal connected to a connecting point of cascode-connected third and fourth transistors in each of the cascode circuits;

a first switch connected to a connecting point of a gate of the first transistor and the first coupling capacitor in each of the cascode circuits; and a second switch connected to a connecting point of a gate of the fourth transistor and the second coupling capacitor in each of the cascode circuits, wherein, during the sampling phase, the first and second switches are turned on to apply a predetermined bias voltage to the gates of the first and fourth transistors, and the input terminal of the differential operational amplifier circuit is set to a common mode voltage, and wherein, during the hold phase, the first and second switches are turned off so that a voltage of each of the gates of the first and fourth transistors change to follow an input signal inputted via the input terminal with the coupling capacitor operating as a level shifter of the input signal, whereby the differential operational amplifier circuit performs push-pull operation that is operative only in a transconductance drive region and prevented from operating in a sieving region.

2. A pipelined A/D converter comprising:

a sample hold circuit for sampling and holding an input signal; and a plurality of stages of A/D converter circuit parts for successively performing A/D conversion of signals sampled and held, wherein each of the A/D converter circuit parts comprises:

a further sample hold circuit for sampling and holding a signal inputted to the A/D converter circuit part;

a sub-A/D converter for performing A/D conversion of a signal inputted to the A/D converter circuit part into a digital output code;

a D/A converter for performing A/D conversion of the digital output code; and a residual error amplifier for obtaining a residual error between a signal sampled and held by the further sample hold circuit and the A/D converted signal and amplifying the residual error, wherein the residual error amplifier is configured to include a telescopic differential operational amplifier circuit for use in the pipelined A/D converter that operates during a sampling phase and a hold phase, the differential operational amplifier circuit including two auxiliary differential amplifiers connected to two cascode circuits, each cascode circuit being configured to include cascode-connected first to fourth transistors, the differential operational amplifier circuit comprising:

an input terminal of the differential operational amplifier circuit, the input terminal being connected to a gate of the first transistor and a gate of the second transistor via first and second coupling capacitors, respectively, in each of the cascode circuits;

an output terminal of the differential operational amplifier circuit, the output terminal connected to a connecting point of a cascode-connected third transistor and fourth transistor in each of the cascode circuits;

a first switch connected to a connecting point of a gate of the first transistor and the first coupling capacitor in each of the cascode circuits; and a second switch connected to a connecting point of a gate of the fourth transistor and the second coupling capacitor in each of the cascode circuits, wherein, during the sampling phase, the first and second switches are turned on to apply a predetermined bias voltage to the gates of the first and fourth transistors, and the input terminal of the differential operational amplifier circuit is set to a common mode voltage, and wherein, during the hold phase, the first and second switches are turned off so that a voltage of each of the gates of the first and fourth transistors change to follow an input signal inputted via the input terminal with the coupling capacitor operating as a level shifter of the input signal, whereby the differential operational amplifier circuit performs push-pull operation that is operative only in a transconductance drive region and prevented from operating in a slewing region, and wherein the sub-A/D converter performs A/D conversion of an input voltage by a 1.5-bit/stage transfer characteristic such that the input voltage is limited in a first reference voltage range narrower than a predetermined reference voltage range, and an output voltage from the sub-A/D converter is limited in a second reference voltage range narrower than the predetermined reference voltage range.

3. The pipelined A/D converter as claimed in claim 2, further comprising a full-scale converter for full-scale converting the digital output code outputted from the sub-A/D converter, by summing up the digital output code and a code obtained by shifting the digital output code by two bits.

4. The pipelined A/D converter as claimed in claim 2, further comprising a reset circuit for resetting the differential operational amplifier circuit so as to short-circuit the output terminal of the differential operational amplifier circuit of the residual error amplifier, for an initial period during the hold phase of each of the A/D converter circuit parts.

5. The pipelined A/D converter as claimed in claim 3, further comprising a reset circuit for resetting the differential operational amplifier circuit so as to short-circuit the output terminal of the differential operational amplifier circuit of the residual error amplifier, for an initial period during the hold phase of each of the A/D converter circuit parts.

* * * * *